US010839920B2

(12) United States Patent
Cesaretti et al.

(10) Patent No.: US 10,839,920 B2
(45) Date of Patent: Nov. 17, 2020

(54) CIRCUIT HAVING A LOW POWER CHARGE PUMP FOR STORING INFORMATION IN NON-VOLATILE MEMORY DURING A LOSS OF POWER EVENT

(71) Applicant: Allegro MicroSystems, LLC, Manchester, NH (US)

(72) Inventors: Juan Manuel Cesaretti, Ciudad de Buenos Aires (AR); Javier Osinaga, Montevideo (UY)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/543,867

(22) Filed: Aug. 19, 2019

(65) Prior Publication Data

US 2019/0371415 A1  Dec. 5, 2019

Related U.S. Application Data

(63) Continuation-in-part of application No. 15/720,533, filed on Sep. 29, 2017, now Pat. No. 10,430,296.

(51) Int. Cl.
*G11C 16/30* (2006.01)
*G11C 16/08* (2006.01)
(Continued)

(52) U.S. Cl.
CPC .......... *G11C 16/30* (2013.01); *G11C 14/0018* (2013.01); *G11C 16/08* (2013.01);
(Continued)

(58) Field of Classification Search
CPC ..................................................... G11C 16/24
See application file for complete search history.

(56) References Cited

U.S. PATENT DOCUMENTS

| 4,570,594 A | 2/1986 | Egami et al. |
| 5,869,962 A | 2/1999 | Kasumi et al. |

(Continued)

FOREIGN PATENT DOCUMENTS

| DE | 101 39 149 A1 | 2/2003 |
| EP | 0 024 836 A1 | 3/1981 |

(Continued)

OTHER PUBLICATIONS

U.S. Appl. No. 16/564,287, filed Sep. 9, 2019, Ross et al.
(Continued)

*Primary Examiner* — Douglas King
(74) *Attorney, Agent, or Firm* — Daly, Crowley, Mofford & Durkee LLP

(57) ABSTRACT

A data storage circuit for storing data from volatile memory to non-volatile memory is powered by a low power charge pump circuit that is independent of the power for the volatile memory and that is activated upon power loss. The low power charge pump circuit includes an amplifier, a voltage-controlled oscillator, a charge pump core, and a voltage divider. The amplifier outputs a current according to a voltage difference between a reference input voltage and a feedback voltage output from the voltage divider. The current is converted to a voltage that controls the oscillator, which outputs a series of pulses to power the charge pump core. The charge pump core in turn provides the output voltage, which may be used to power an attached load. The attached load may be a programming port for an EEPROM.

20 Claims, 9 Drawing Sheets

(51) Int. Cl.
  *G11C 16/24* (2006.01)
  *G11C 16/32* (2006.01)
  *G11C 14/00* (2006.01)
  *G11C 16/10* (2006.01)
  *B62D 5/04* (2006.01)
  *G11C 16/04* (2006.01)

(52) U.S. Cl.
  CPC .............. *G11C 16/10* (2013.01); *G11C 16/24* (2013.01); *G11C 16/32* (2013.01); *B62D 5/0457* (2013.01); *G11C 16/0408* (2013.01)

(56) References Cited

U.S. PATENT DOCUMENTS

| | | | |
|---|---|---|---|
| 5,917,320 | A | 6/1999 | Scheller et al. |
| 6,044,004 | A | 3/2000 | Kramer |
| 6,091,239 | A | 7/2000 | Vig et al. |
| 6,242,908 | B1 | 6/2001 | Scheller et al. |
| 6,252,395 | B1 | 6/2001 | Aoyama et al. |
| 6,297,627 | B1 | 10/2001 | Towne et al. |
| 6,445,176 | B1 | 9/2002 | Wallrafen |
| 6,459,173 | B1 | 10/2002 | Gunsaulus et al. |
| 6,525,531 | B2 | 2/2003 | Forrest et al. |
| 6,781,359 | B2 | 8/2004 | Stauth et al. |
| 6,815,944 | B2 | 11/2004 | Vig et al. |
| 7,026,808 | B2 | 4/2006 | Vig et al. |
| 7,033,071 | B2 | 4/2006 | Otsuka |
| 7,184,876 | B2 | 2/2007 | Teulings et al. |
| 7,199,579 | B2 | 4/2007 | Scheller et al. |
| 7,265,531 | B2 | 9/2007 | Stauth et al. |
| 7,362,094 | B2 | 4/2008 | Voisine et al. |
| 7,368,904 | B2 | 5/2008 | Scheller et al. |
| 7,369,969 | B2 | 5/2008 | Scherr |
| 7,573,112 | B2 | 8/2009 | Taylor |
| 7,592,801 | B2 | 9/2009 | Bailey et al. |
| 7,622,914 | B2 | 11/2009 | Bailey et al. |
| 7,676,914 | B2 | 3/2010 | Taylor |
| 7,687,882 | B2 | 3/2010 | Taylor et al. |
| 7,772,838 | B2 | 8/2010 | Bailey et al. |
| 7,923,997 | B2 | 4/2011 | Utsuno |
| 8,022,692 | B2 | 9/2011 | Fernandez et al. |
| 8,093,670 | B2 | 1/2012 | Taylor |
| 8,138,750 | B2 | 3/2012 | Fink et al. |
| 8,350,563 | B2 | 1/2013 | Haas et al. |
| 8,598,867 | B2 | 12/2013 | Foletto et al. |
| 8,680,848 | B2 | 3/2014 | Foletto et al. |
| 8,723,512 | B1 | 5/2014 | Burdette et al. |
| 8,729,890 | B2 | 5/2014 | Donovan et al. |
| 8,736,260 | B2 | 5/2014 | Foletto et al. |
| 8,754,640 | B2 | 6/2014 | Vig et al. |
| 8,860,404 | B2 | 10/2014 | Dwyer et al. |
| 8,860,410 | B2 | 10/2014 | Petrie |
| 8,970,265 | B2 | 3/2015 | McIntosh et al. |
| 9,007,054 | B2 | 4/2015 | Friedrich et al. |
| 9,052,349 | B2 | 6/2015 | Haas et al. |
| 9,062,990 | B2 | 6/2015 | Petrie |
| 9,222,990 | B2 | 12/2015 | Dwyer et al. |
| 9,395,391 | B2 | 7/2016 | Fernandez et al. |
| 9,476,899 | B2 | 10/2016 | Fernandez et al. |
| 9,513,337 | B2 | 12/2016 | Forrest et al. |
| 9,520,871 | B2 | 12/2016 | Eagen et al. |
| 9,548,443 | B2 | 1/2017 | Wang |
| 9,625,534 | B2 | 4/2017 | Cadugan et al. |
| 9,644,999 | B2 | 5/2017 | Foletto et al. |
| 9,984,762 | B1 | 5/2018 | Seshasayee et al. |
| 10,066,965 | B2 | 9/2018 | Foletto et al. |
| 10,411,498 | B2 | 9/2019 | Shoemaker et al. |
| 10,430,296 | B2 | 10/2019 | Cesaretti et al. |
| 10,483,846 | B1 | 11/2019 | Allegrini et al. |
| 10,511,223 | B2 | 12/2019 | McIntosh et al. |
| 10,635,539 | B2 | 4/2020 | Cook et al. |
| 2005/0146322 | A1 | 7/2005 | Hoffman et al. |
| 2006/0224350 | A1 | 10/2006 | Tanizawa |
| 2008/0074106 | A1 | 3/2008 | Oohira |
| 2009/0206829 | A1 | 8/2009 | Kamiya et al. |
| 2010/0023682 | A1 | 1/2010 | Lee et al. |
| 2010/0046121 | A1 | 2/2010 | Osugi et al. |
| 2010/0052424 | A1 | 3/2010 | Taylor et al. |
| 2011/0119015 | A1 | 5/2011 | Hirobe et al. |
| 2012/0170397 | A1 | 7/2012 | Kim et al. |
| 2016/0231393 | A1 | 8/2016 | Fernandez et al. |
| 2017/0117801 | A1 | 4/2017 | Shoemaker et al. |
| 2017/0191852 | A1 | 7/2017 | Foletto et al. |
| 2017/0199536 | A1* | 7/2017 | Verma .................... G05F 1/575 |
| 2017/0228154 | A1 | 8/2017 | Liu et al. |
| 2018/0259594 | A1 | 9/2018 | Fernandez et al. |
| 2019/0370125 | A1 | 12/2019 | Cesaretti et al. |

FOREIGN PATENT DOCUMENTS

| | | |
|---|---|---|
| EP | 0 456 392 A2 | 11/1991 |
| EP | 0 456 392 A3 | 11/1991 |
| JP | H04-40007 | 2/1992 |
| JP | H11-257993 | 9/1999 |
| JP | 2000-258162 A | 9/2000 |
| JP | 2001-153745 A | 6/2001 |
| JP | 2003-315770 | 11/2003 |
| JP | 2004/040007 | 2/2004 |
| JP | 2004-245804 A | 9/2004 |
| JP | 2004-279324 A | 10/2004 |
| JP | 2008/256415 | 10/2008 |
| JP | 2009/128437 A | 6/2009 |
| JP | 2009-281881 A | 12/2009 |
| JP | 2010/049755 A | 3/2010 |
| WO | WO 2004/079385 A1 | 9/2004 |
| WO | WO 2007/000746 A2 | 1/2007 |
| WO | WO 2008/145662 A1 | 12/2008 |
| WO | WO 2010/010811 A1 | 1/2010 |
| WO | WO 2013/017211 A1 | 2/2013 |

OTHER PUBLICATIONS

Allegro Microsystems, Inc.; Data Sheet ATS673 and ATS674; Self-Calibrating TPOS Gear Tooth Sensor IC Optimized for Automotive Cam Sensing Application; Nov. 2, 2009; 20 pages.

Allegro Microsystems, Inc.; Data Sheet ATS675LSE; Self-Calibrating TPOS Speed Sensor IC Optimized for Automotive Cam Sensing Applications; 2008-2009; 13 pages.

Allegro Microsystems, Inc.; Design Intent Data Sheet; A1340; "High Precision, Highly Programmable Linear Hall Effect Sensor IC with EEPROM and Analog Output with Advanced Output Linearization Capabilities;" Sep. 10, 2009; 40 Pages.

Allegro Microsystems, Inc.; Design Intent Data Sheet; A1341; "High Precision, Highly Programmable Linear Hall Effect Sensor IC with EEPROM, Output Protocols SENT and PWM, and Advanced Output Linearization Capabilities;" May 17, 2010; 46 Pages.

Communication pursuant to Rules 161(1) and 162 EPC dated Apr. 23, 2013 for Pat. App. No. 11767332.7; 2 pages.

Communication pursuant to Article 94(3) EPC dated May 31, 2017 for EP Pat. Appl. No. 12809919.9-1568; 5 pages.

Corrected Notice of Allowability dated May 23, 2016 for U.S. Appl. No. 13/833,847; 7 Pages.

European Notice of Allowance dated Aug. 29, 2014; for European Pat. App. No. 11767332.7; 7 pages.

European Notice of Allowance dated Apr. 5, 2017; for European Pat. App. No. 15156 091.9; 7 pages.

European Response to Written Opinion (including English claims) filed on May 19, 2015; for European Pat. App. No. 12809919.9; 11 pages.

Extended Search Report and Written Opinion of the ISA dated Apr. 21, 2015 for European Pat. App. No. 15156091.9; 9 pages.

Japanese Office Action with English translation dated Oct. 27, 2015; for Japanese Pat. App. 2013-533859; 4 pages.

Japanese Voluntary Amendment (With Reporting Letter and Claims in English) filed on Jun. 14, 2016 for Japanese application No. 2016-030552; 16 Pages.

Melexis MLX 90324; ""Under-the-Hood" Triaxis Rotary Position feat. SENT Protocol;" 3901090324 Data Sheet; Dec. 2008; 40 pages.

(56) References Cited

OTHER PUBLICATIONS

Notice of Allowance dated Jan. 17, 2014 for U.S. Appl. No. 13/345,021; 15 pages.
Notice of Allowance dated Dec. 19, 2014; for U.S. Appl. No. 13/705,423; 18 pages.
Office Action for U.S. Appl. No. 13/833,847 dated Jul. 2, 2015; 42 pages.
Office Action for U.S. Appl. No. 14/250,574 dated Sep. 2, 2016; 31 pages.
PCT International Preliminary Report on Patentability and Written Opinion of the ISA; dated Apr. 25, 2013; for PCT Pat. App. No. PCT/2011/051493; 10 pages.
PCT International Preliminary Report on Patentability with Written Opinion for PCT/US2012/068879 dated Jul. 17, 2014 7 pages.
PCT International Preliminary Report on Patentability and Written Opinion of the ISA dated Sep. 24, 2015; For Pat. App. No. PCT/US2014/015678; 13 pages.
PCT Search Report and Written Opinion of the ISA dated Nov. 14, 2011 for PCT Pat. App. No. PCT/US2011/051493; 12 pages.
PCT Search Report and Written Opinion of the ISA; dated Mar. 27, 2013 for PCT Pat. App. No. PCT/US2012/068879; 10 pages.
PCT Search Report and Written Opinion of the ISA dated Aug. 21, 2014 for PCT Pat. App. No. PCT/US2014/015678; 18 pages.
Pre-Trial Report with English Translation dated Apr. 14, 2016; for Japanese Pat. App. No. 2013-533859; 9 pages.
Response dated Oct. 2, 2015 to Office Action dated Jul. 2, 2015 for U.S. Appl. No. 13/833,847; 12 Pages.
Response dated Jan. 28, 2016 to European Office Action dated Aug. 3, 2015; for European Pat. App. No. 15156091.9; 5 pages.
Response to European Official Communication filed on Oct. 31, 2013 for European Pat. App. No. 11767332.7; 21 pages.
Response dated Apr. 28, 2016 to Office Action dated Oct. 21, 2015 for European Pat. App. No. 14706448.9; 4 pages.
Response to Office Action dated Sep. 2, 2016 from U.S. Appl. No. 14/250,574, filed Nov. 22, 2016; 14 Pages.
Translation of Reasons for Rejection dated Dec. 26, 2016 for JP Pat. Appl. No. 2016-030552; 11 pages.
U.S. Non-Final Office Action dated Oct. 2, 2018 for U.S. Appl. No. 15/720,533; 14 Pages.
Response to U.S. Non-Final Office Action dated Oct. 2, 2018 for U.S. Appl. No. 15/720,533; Response filed Jan. 2, 2019; 11 Pages.
U.S. Final Office Action dated Mar. 28, 2019 for U.S. Appl. No. 15/720,533; 14 Pages.
Response to U.S. Final Office Action dated Mar. 28, 2019 for U.S. Appl. No. 15/720,533; Response filed Jun. 24, 2019; 9 Pages.
U.S. Notice of Allowance dated Jul. 24, 2019 for U.S. Appl. No. 15/720,533; 9 Pages.
U.S. Preliminary Amendment filed on Aug. 21, 2019 for U.S. Appl. No. 16/540,409; 5 Pages.

* cited by examiner

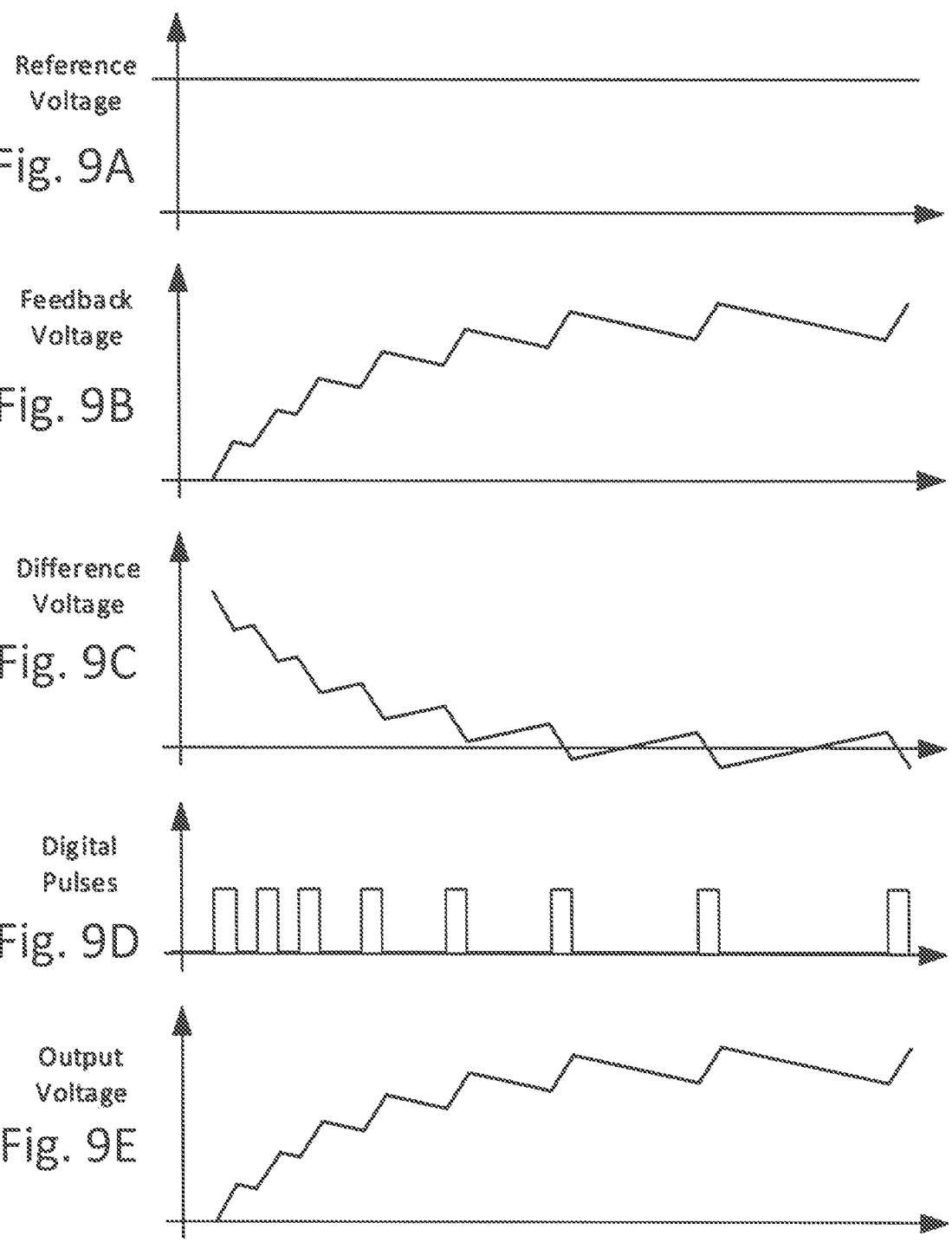

CIRCUIT HAVING A LOW POWER CHARGE PUMP FOR STORING INFORMATION IN NON-VOLATILE MEMORY DURING A LOSS OF POWER EVENT

CROSS REFERENCE TO RELATED APPLICATION

This application is a continuation-in-part of U.S. application Ser. No. 15/720,533 entitled "Circuit and Method for Storing Information in Non-Volatile Memory During a Loss of Power Event", filed Sep. 29, 2017 and naming at least one common joint inventor, the entire contents of which are incorporated herein by reference.

BACKGROUND

In many systems, important data may need to be saved upon an interruption of power in order to resume normal system operation when power is restored. In some systems, saving this information requires circuitry having a large backup power source (e.g., a battery and/or large capacitor) having enough stored energy to keep the circuitry operational while data is saved during a shutdown process.

Because non-volatile memory (memory that can retain data without a power connection) is generally slower and less robust for handling repeated in-process data storage, circuits typically include volatile memory (e.g., RAM) for saving data during real-time operations (e.g., tracking in memory the position of a moving object). On the other hand, non-volatile memory such as an electrically erasable read only memory (EEPROM) is often used for storing data when a continuous power source isn't available and/or data needs to be saved and restored when a system powers down and restarts. In some systems, volatile memory may include memory registers which operate to store and/or update the continuous stream of data.

A vehicular electronic steering system is an example of a system which continuously updates memory in order to track and update the position of a steering wheel. Circuitry used in some electronic steering systems includes a so-called "turns count register" that is used to keep count of a number of wheel turns beyond 360 degrees e.g. the number of turns made by a gear tooth. The angular change for which the register is incremented/decremented is programmable.

The turns count register circuitry receives power from a power supply. If the power supply fails or is otherwise disconnected from the circuitry, the information in the turns counter register may be lost.

To prevent loss of information from the turns counter register, the part may also comprise a non-volatile memory (i.e. a memory not affected by the loss of power such as an EEPROM) in which information from the turns counter register may be stored in response to power loss. To transfer data from the part to the non-volatile memory, a control pulse having a predetermined voltage (e.g. 15, 18, or 19 volts) must be applied to the EEPROM for a predetermined amount of time (e.g. about 10 milliseconds).

One way to ensure that such a pulse is provided in the event of a loss of power from power supply is to have an external capacitor of considerable size (e.g. having a capacitance in the microFarad range) which can power a charge-pump (and associated control circuitry) and the non-volatile memory (e.g. an EEPROM) for an amount of time sufficient for the pulse to be applied. However, such large external capacitors take up critical space where demands for ever smaller circuitry, for which more sensitive data is becoming needed for storage and during a power interruption as such systems become more complex and data intensive. Thus, circuitry for saving larger amounts of data using less power is desired.

SUMMARY OF DISCLOSED EMBODIMENTS

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Disclosed embodiments provide a low power charge pump circuit that does not require large, external capacitors to operate an EEPROM control pulse during an "emergency write" of data from a volatile memory. Rather, a smaller capacitor (e.g. on the order of 100 nF) may be used to power the charge pump. Because the average current consumption during the emergency write can only be in the order of a few microamperes, a traditional charge pump is ill suited for this use.

In accordance with the concepts, systems and techniques described herein, a circuit includes: (a) a matrix of non-volatile memory cells capable of backing up data in the event of a power loss (b) a main memory; (c) a main memory controller coupled to said main memory; (d) a single row of memory cells that are detached from the matrix such that the circuit can be configured to write data to the single detached block without writing or overwriting data in the matrix.

In embodiments, the circuit can be configured such that the detached block operates as if it were a connected block of the matrix.

In embodiments, the matrix is a programmable nonvolatile memory such as an electrically erasable read only memory (EEPROM) and the detached block is a single EEPROM row detached from (or independent of) the EEPROM matrix. It should, of course, also be appreciated that the detachable block may also be provided as a single, detached, EEPROM column or from one or more groups of independent EEPROM cells (e.g. individual cells configured to form or operate as a block).

In embodiments, the circuit can detect loss-of-power events and in response to a detection of a loss of power automatically stores at least portions of contents of main memory (e.g., volatile memory) to the detached block without using the added power that would normally be needed to write to the detached block if it were integrated normally with the matrix memory.

In an embodiment, a turns counter register in non-volatile memory is provided for tracking the movement and/or position of an object. In an embodiment, the turns count register is connected to a steering wheel and column in order to track the position of the steering wheel and thus the position of the steering wheel or steering mechanism. By providing the non-volatile memory as a single EEPROM block (e.g., one or more cells or a row or a column) detached from other blocks in an EEPROM, data from the turns count register can be stored in a portion of the EEPROM without needing to power the entire EEPROM and/or other non-volatile memory.

A circuit provided in accordance with some EEPROM embodiments described herein has at least two advantages over prior art circuits: first, because a single EEPROM block is used, ones and zeros can be programmed concurrently which means that only a single pulse is needed in contrast with conventional EEPROMS which typically require a first pulse to erase the block and a second pulse to set selected bits to a desired logical value—e.g. a logical value of one); and second, since the independent memory (i.e. single EEPROM block) contains its own simpler drivers (e.g. EEPROM drivers) and a simpler overall arrangement, the amount of power needed to activate and/or program the single EEPROM block is much less than is required to power and/or program a conventional EEPROM matrix.

Furthermore, in order to save space required by control switches, the cells (bits) on a conventional EEPROM matrix are not addressed individually, but rather are typically addressed in rows. This may lead to some complications with respect to how the programming/erasing voltages are applied to the EEPROM cells. For example, some conventional EEPROM matrices, utilize ⅓, ⅔ voltages to avoid inadvertently programming other cells in an addressing matrix.

In the embodiments described herein, however, a single pulse is used to program the EEPROM block. There is no need to utilize ⅓, ⅔ voltages common to existing EEPROM designs to avoid inadvertently programming other cells in an addressing matrix. Since there is no need for ⅓, ⅔ voltages, emergency backup data circuits and systems provided in accordance with the concepts described herein need not drive a ⅓, ⅔ resistor divider which saves current. This provides an extra degree of freedom to optimize (i.e., ideally minimize) power consumption and area/complexity.

Thus, use of a single EEPROM block enables concurrent programming of bits with a single pulse and provides an extra degree of freedom to optimize power consumption and area/complexity.

In accordance with one aspect of the concepts described herein, data storage circuit for storing data from volatile memory in response to a power loss includes an input for receiving a power loss signal in response to a power loss from at least one power source, an input configured to receive data from a volatile memory, a single block of non-volatile matrix of memory cells and a driver circuit coupled to said single block of non-volatile matrix of memory cells, said driver circuit configured to write data to and read data from said single block of non-volatile matrix of memory cells, the driver circuit further configured to write to said single block with a single control pulse.

The data storage circuit may include one or more of the following features independently or in combination with one or more other features to include wherein the single block of non-volatile matrix of memory cells is provided as a single block electrically erasable programmable read only memory (EEPROM); wherein the driver circuit is provided as a single block EEPROM driver circuit coupled to the single block EEPROM, the EEPROM driver circuit configured to write data to and read data from the single block EEPROM; wherein the single block of non-volatile matrix of memory cells is a single row EEPROM; wherein the single block EEPROM is provided as one of a plurality of rows and a plurality of columns of a matrix of EEPROM cells configured and arranged for being written to by utilizing collective row and column operations by one or more driver circuits and wherein the single block EEPROM corresponds to an independent block of the matrix of EEPROM cells and wherein the single block of EEPROM cells is further configured such that in response to the data storage circuit receiving a power loss signal, data is written from a volatile memory to the single block of EEPROM cells; where the circuit further includes a controller configured to receive the power loss signal and in response thereto to write data from a volatile memory to the independent single block of non-volatile matrix of memory cells via the single block EEPROM driver circuit; wherein the single block of non-volatile matrix of memory cells is provided as one of a plurality of rows and a plurality of columns of a non-volatile matrix of memory cells configured and arranged for being written to by utilizing collective row and column operations by one or more driver circuits; wherein the single block of non-volatile matrix of memory cells corresponds to an independent block of the matrix of memory cells; wherein the single block of non-volatile matrix of memory cells is further configured and arranged for being written to independently of the other memory cells of the matrix of memory cells in response to the power loss signal.

In accordance with a further aspect of the concepts described herein, a data storage circuit for storing data from volatile memory in response to a power loss includes an input for receiving a power loss signal in response to a power loss from at least one power source, an input configured to receive data from volatile memory, a non-volatile matrix of memory cells comprising a plurality of rows and a plurality of columns configured and arranged for being written to by utilizing collective row and column operations in the absence of a power loss, the plurality of memory cells including an independent subset block of memory cells further configured and arranged for being written to independently of each of the other memory cells in response to the power loss signal and a controller configured to receive the power loss signal and configured to write data from said volatile memory to said independent subset block in response to receiving the power loss signal.

The data storage circuit may include one or more of the following features independently or in combination with one or more other features to include the non-volatile matrix of memory cells forms the memory of an EEPROM; the data storage circuit may further include a plurality of EEPROM column drivers and a plurality of EEPROM row drivers, the plurality of EEPROM column and row drivers arranged and configured to coordinate reading and writing to multiple rows and columns of the EEPROM; an energy storing device; the controller is configured, in response to the power loss signal, to selectively direct energy from the energy storing device to writing of data from said volatile memory to said independent subset block; a clock signal generator, wherein the coordinated reading and writing from said plurality of column and row drivers is timed to a clock signal from the clock signal generator and wherein the writing of data from said volatile memory to said independent subset block in response to the power loss signal is controlled without utilizing a clock signal; wherein the controller is configured to write to the independent subset block in response to a power loss signal without overwriting at least a portion of the plurality of memory cells of the EEPROM; wherein the controller is configured to write to the independent subset block in response to a power loss signal without writing to any other of the plurality of memory cells of the EEPROM; an independent memory driver configured to be selectively powered from the energy storing device to write to the independent subset block in response to a power loss signal; wherein said independent subset block is an independent row of said EEPROM further comprising an independent row driver configured to be selectively powered from the energy storing device to write to the independent row in response to a power loss signal; wherein the energy storing device comprises a charge pump and a charge pump switch configured to release power stored in the charge pump when switched, the charge pump switch coupled between the charge pump and the independent memory driver and configured to switch closed by receiving a signal from the controller in response to the power loss signal; wherein the controller is arranged and configured to write data from said volatile memory to said independent subset block in less than about 10 milliseconds; wherein the volatile memory includes a turns count register configured and arranged to store a value representing the angle of rotation of an object; wherein the object is the steering wheel of a vehicle; wherein the volatile memory includes a turn register configured and arranged to store a value representing the rate of rotation of an object.

In accordance with a still further aspect of the concepts described herein, a method of transferring data from a volatile memory circuit to an EEPROM during a power interruption includes transmitting a power loss signal in a primary circuit, the power loss signal representing that a power supply coupled to the primary circuit has been interrupted, receiving the power loss signal in a controller, the controller configured to, in response to receiving the power loss signal, writing data from the volatile memory circuit to an independent EEPROM memory block of a matrix of memory cells of the EEPROM, the matrix having a plurality of rows and a plurality of columns of memory cell; wherein the writing occurs while not writing to any of the other rows of the EEPROM that do not contain the memory block; and operating the matrix of memory cells, including the independent memory block, utilizing collective row and column EEPROM operations while the power loss signal is not active.

The data storage method may include one or more of the following features independently or in combination with one or more other features to include the writing to the independent block of the EEPROM is powered by residual power in the primary circuit; the residual power is supplied by power stored in a charge pump, the charge pump's residual power released by switching a charge pump switch in response to the power loss signal; writing data from the volatile memory circuit to an independent EEPROM block is executed without utilizing a clock signal.

In accordance with a still further aspect of the concepts described herein, a data storage circuit for storing data from volatile memory in response to a power loss includes means for writing data, in response to a power loss in the data storage circuit, from volatile memory to an independent memory clock of a matrix of non-volatile memory cells while not writing data to other memory cells of the matrix.

The data storage circuit may include one or more of the following features independently or in combination with one or more other features to include the non-volatile memory cells are cells of an EEPROM.

In an embodiment, the non-volatile memory cells are cells of an EEPROM.

In accordance with an integrated data storage circuit (IC) for storing data from volatile memory in response to a power loss includes volatile memory means, non-volatile memory means, means for detecting a loss of power to the IC and for providing a power loss signal in response to detection of a loss of power, and means, responsive to the power loss signal, for transferring data from said volatile memory means to said non-volatile memory means in response to the power loss signal.

In an embodiment, the non-volatile memory means is an EEPROM block means.

In an embodiment, the energy storage means is a capacitor and charge pump means.

In accordance with a still further aspect of the concepts described herein, a data storage circuit includes a charge pump, a main memory, a turns count register, a memory matrix of non-volatile memory cells, a main memory controller coupled to said main memory; an EEPROM memory block detached from the main memory controller and the memory matrix, one or more EEPROM programming switches, a first switch coupled between said charge pump and said EEPROM programming switches and a digital controller coupled to said first switch, said EEPROM programming switches and to said EEPROM wherein, in response to a loss of power to the turns count register, the digital controller places the first switch in a closed position such that said charge pump provides a signal which keeps the EEPROM programming switches biased for a period of time sufficient for data in the turns count register to be stored in a said detached EEPROM memory block.

In accordance with a still further aspect of the concepts described herein a data storage circuit for storing data from volatile memory in response to a power loss includes an input for receiving a power loss signal in response to a power loss from at least one power source, an input configured to receive data from a volatile memory, an energy storage devices, one or more switch elements coupled between the energy storage device and said single block of nonvolatile matrix of memory cells said one or more switch elements configured to selectively couple said single block of nonvolatile memory to said energy storage device in response to an indication of power loss, a single block of non-volatile matrix of memory cell and a driver circuit coupled to said single block of non-volatile matrix of memory cells, said driver circuit responsive to the power loss signal and configured to write data to and read data from said single block of non-volatile matrix of memory cells, the driver circuit further configured to write to said single block with a single control pulse in response to an indication of power loss provided thereto.

In an embodiment, the period of time is about 10 milliseconds or less.

In an embodiment, the energy storage device is configured to store no more than about the energy required to keep the EEPROM programming switches biased for the period of time.

In accordance with a further aspect of the concepts described herein, a data storage circuit for storing data from volatile memory in response to a power loss includes a non-volatile matrix of memory cells comprising a plurality of rows and a plurality of columns of memory cells including an independent row of memory cells, and a controller comprising a plurality of drivers including row and column drivers and an independent driver. The controller is configured to: in the absence of a power loss, write data from the volatile memory to the non-volatile matrix of memory cells by utilizing the row and column drivers to perform collective row and column operations. The controller is further configured to: in response to receiving a power loss signal write data from said volatile memory to said independent row of memory cells by selectively supplying energy to the independent row driver and not the row and column drivers from a low power charge pump circuit.

The low power charge pump circuit includes an amplifier configured to provide at an amplifier output a signal having an electrical characteristic that is proportional to a voltage difference between a reference voltage and a feedback voltage. The low power charge pump circuit also includes a voltage-controlled oscillator (VCO) having an input coupled to the amplifier output, the VCO configured to provide at a VCO output a series of electrical pulses according to a pulse frequency that is proportional to the amplifier output signal.

The low power charge pump circuit further includes a charge pump core having an input coupled to the VCO output, the charge pump core configured to provide an output voltage for the low power charge pump circuit according to energy received from the series of electrical pulses. The low power charge pump circuit finally includes a voltage scaler, coupled to the output voltage for the low power charge pump circuit, the voltage scaler configured to produce the feedback voltage as a fraction of the output voltage for the low power charge pump circuit.

In some embodiments, the amplifier comprises a transconductance amplifier. In some embodiments, the reference voltage comprises a bandgap voltage reference. In some embodiments, the voltage-controlled oscillator outputs the series of electrical pulses as rectangular waves. In some embodiments, a maximum pulse frequency of the series of electrical pulses is approximately 700 kilohertz. In some embodiments, a steady state pulse frequency of the series of electrical pulses is approximately 20 kilohertz. In some embodiments, the average output voltage at a steady state is approximately 14.5 volts. In some embodiments, a rise time between the output voltage being zero and the average output voltage having a steady state is approximately 200 microseconds. Some embodiments further include a switch that actuates, according to the power loss signal, to couple the reference voltage to the amplifier. In some embodiments, the non-volatile memory comprises an electrically erasable programmable read only memory (EEPROM).

Some embodiments comprise a circuit having means for performing the above-described functions.

It is appreciated that the above-described embodiments are merely illustrative, and that a person having ordinary skill in the art may readily see how to make and use other low power charge pumps in accordance with the concepts, techniques, and structures disclosed herein.

BRIEF DESCRIPTION OF THE DRAWINGS

Other aspects, features, and advantages of the claimed concepts will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features. Furthermore, the drawings are not necessarily to scale, emphasis instead being placed on the concepts disclosed herein.

The foregoing features may be more fully understood from the following description of the drawings in which:

FIGS. 9A to 9E are plots of simulated voltages as a function of time at different points in the circuit of FIG. 2.

DETAILED DESCRIPTION

In this specification, including the appended claims, the following quoted terms shall have the indicated meanings that are not limited to specific embodiments, except where expressly indicated otherwise:

"Volatile memory" means any electric device capable of storing retrievable data only while power is continuously supplied. Volatile memory is typically provided as random-access memory ("RAM"), and includes, without limitation, dynamic RAM ("DRAM"), synchronous DRAM ("SDRAM"), and double-data rate ("DDR") SDRAM.

"Non-volatile memory" means any electric device capable of storing retrievable data without a continuous power supply. Non-volatile memory may comprise solid-state memory having no moving parts, for example a flash drive or solid-state drive. Alternately, non-volatile memory may comprise a moving disc or tape for storing data and an apparatus for reading (and possibly writing) the data. Data may be stored (and possibly rewritten) optically, for example on a compact disc ("CD"), digital video disc ("DVD"), or Blu-ray disc ("BD"), or magnetically, for example on a disc in a hard disk drive ("HDD") or a floppy disk, or on a digital audio tape ("DAT"). Non-volatile memory may be, for example, read-only ("ROM"), write-once read-many ("WORM"), programmable ROM ("PROM"), erasable PROM ("EPROM"), or electrically erasable PROM ("EEPROM").

Figure 1:
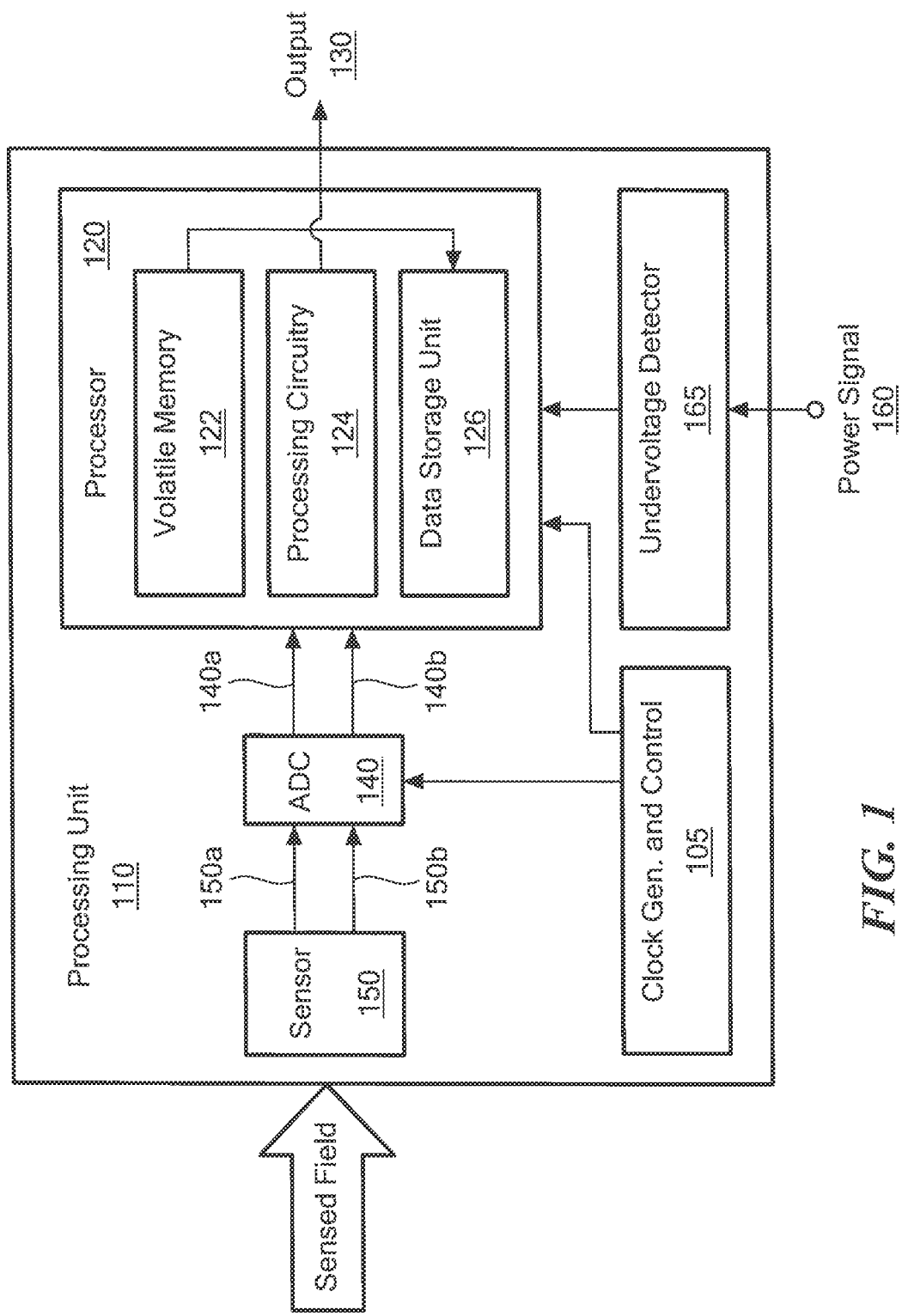
FIG. 1 is a block diagram of a circuit for storing information in non-volatile memory in response to a loss of power according to some embodiments.

Referring now to FIG. 1, a block diagram of an example circuit for storing information in non-volatile memory in response to a loss of power according to some embodiments is shown. A processing unit 110 receives input in a sensor 150 from a sensed field 145. In an embodiment, one or more analog signals 150a and 150b from the sensor 150 (e.g., a magnetic field sensor) are transmitted to an analog to digital converter (ADC) 140. ADC 140 receives the analog signals provided thereto and generates digital signals 140a and 140b that are further transmitted or otherwise coupled or provided to a digital processor 120.

Data from the ADC can be stored in main volatile memory 122 (e.g., RAM) or in a data storage unit 126 used at least in part for non-volatile data storage. Processing circuitry 124 processes storage of data in volatile memory 122 and data storage unit 126. A clock generator and timer circuit 105 is configured to send clock signals to the ADC 140 and processor 120 in order to time the processing, delivery, and storage of data from the ADC. In embodiments, the processing unit outputs signals 130 (including data from volatile memory 122 and the data storage unit 126) to components such as, for example, other elements of a system in which the processing unit 110 is integrated (e.g., the drive mechanism shown in FIG. 5).

A power loss detector 165 can detect a power loss in power signal 160 and in response thereto may deliver one or more signals to processor 120 indicating if appropriate power levels from a power source (not shown) is being provided to processing unit 110 (or to one or more circuits within processing unit 110).

In the event of receiving a power loss signal from detector 165, processor 120 is configured and programmed to begin a data retention process that transfers specific data present from volatile memory 122 into non-volatile memory (e.g., in data storage unit 126) such as further described in embodiments herein. In certain embodiments, the retention process utilizes and selectively focuses stored power on saving the specific data to selected non-volatile memory 122 such as an individual and detached electrically erasable read only memory (EEPROM) block (e.g., see FIGS. 2, 3, 4, and 6). This way, more data can be saved during a power loss and recovered when power is restored to the processing unit 110, without the need for high-footprint power storage elements (e.g., batteries, large capacitors) needed to power and operate an entire data storage system for long enough periods of time to save sensitive data.

Figure 4:
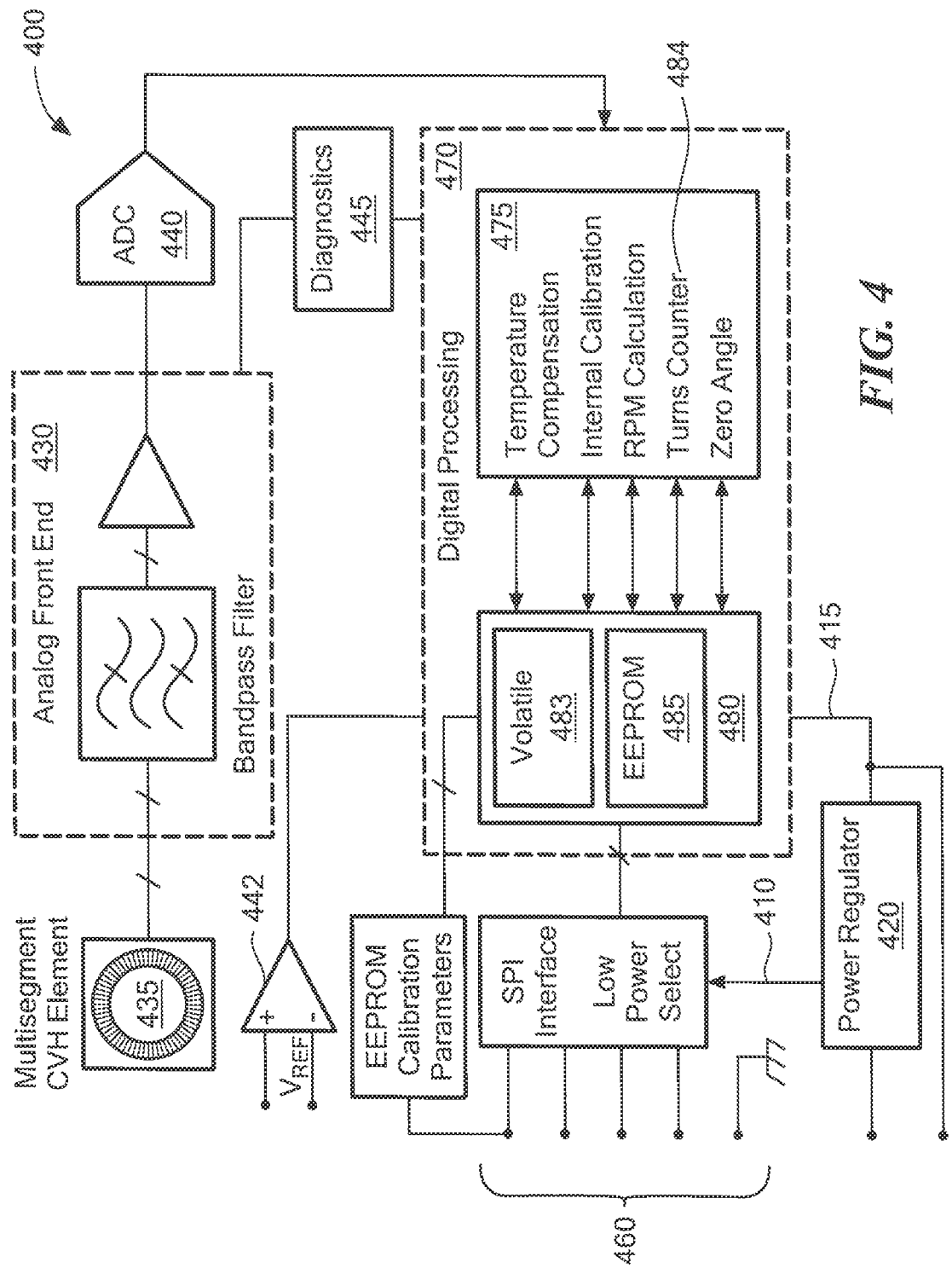
FIG. 4 is a block diagram of an angle sensor circuit that includes a circuit for storing information from register memory to an EEPROM in response to a loss of power according to some embodiments.
Figure 5:
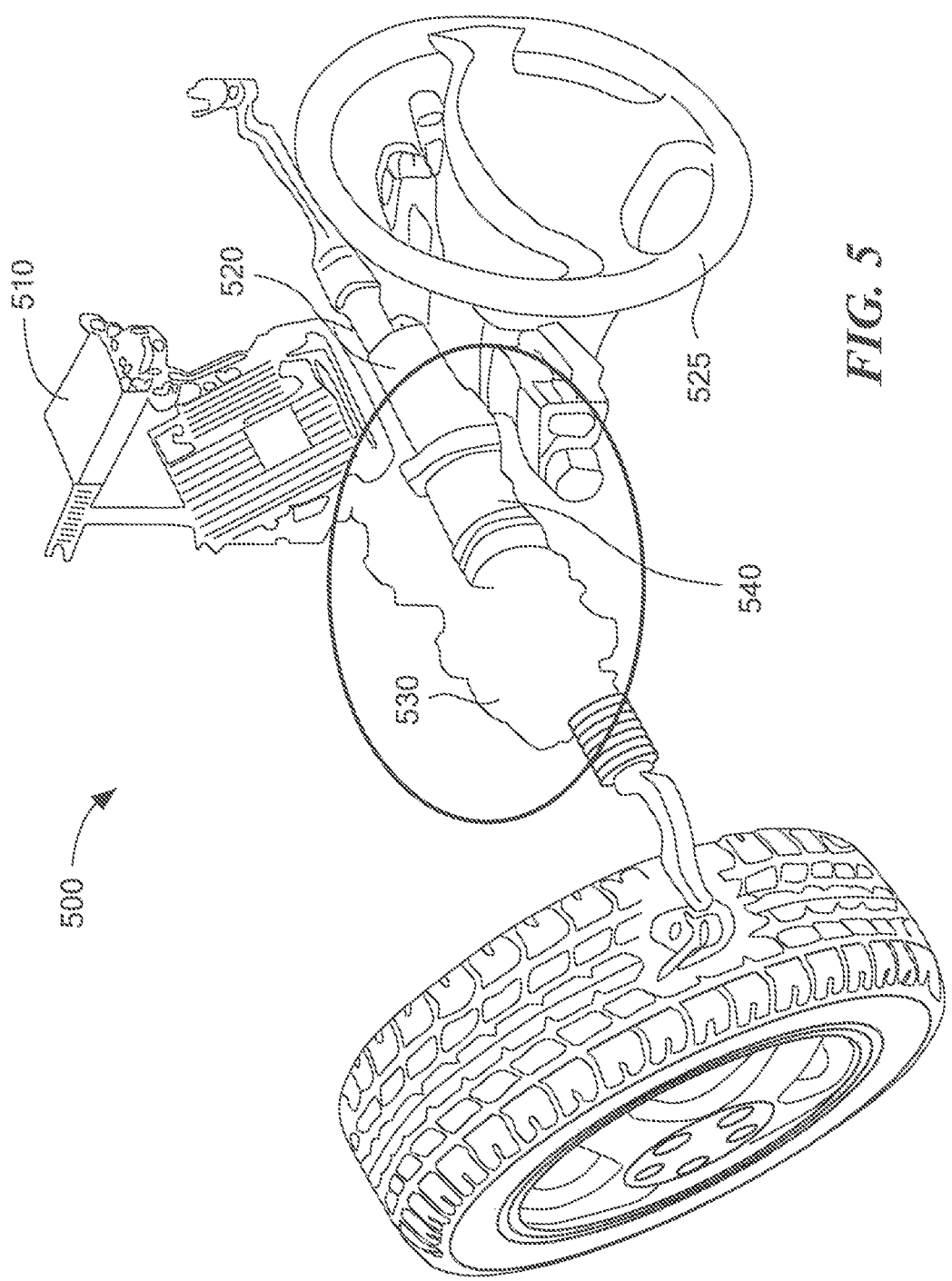
FIG. 5 is an isometric view of a portion of a vehicle which includes a circuit for storing information in non-volatile memory in response to a loss of power memory in response to a loss of power according to some embodiments.

In some embodiments, the sensed field corresponds to a system of magnetic field sensors used, for example, to track the position and/or rotation of an object such as a steering column of a vehicle (see, e.g., FIGS. 4 and 5 and accompanying description). In order to facilitate real-time tracking of the wheel rotation, a turns count register, for example, in volatile memory may be used to store input from a turns counter. When power to the system is interrupted, present embodiments can be used to transfer and save the position stored in the turns count register to non-volatile memory such as described. When the power to the system is restored, the turns count register can be updated from non-volatile memory.

Figure 2:
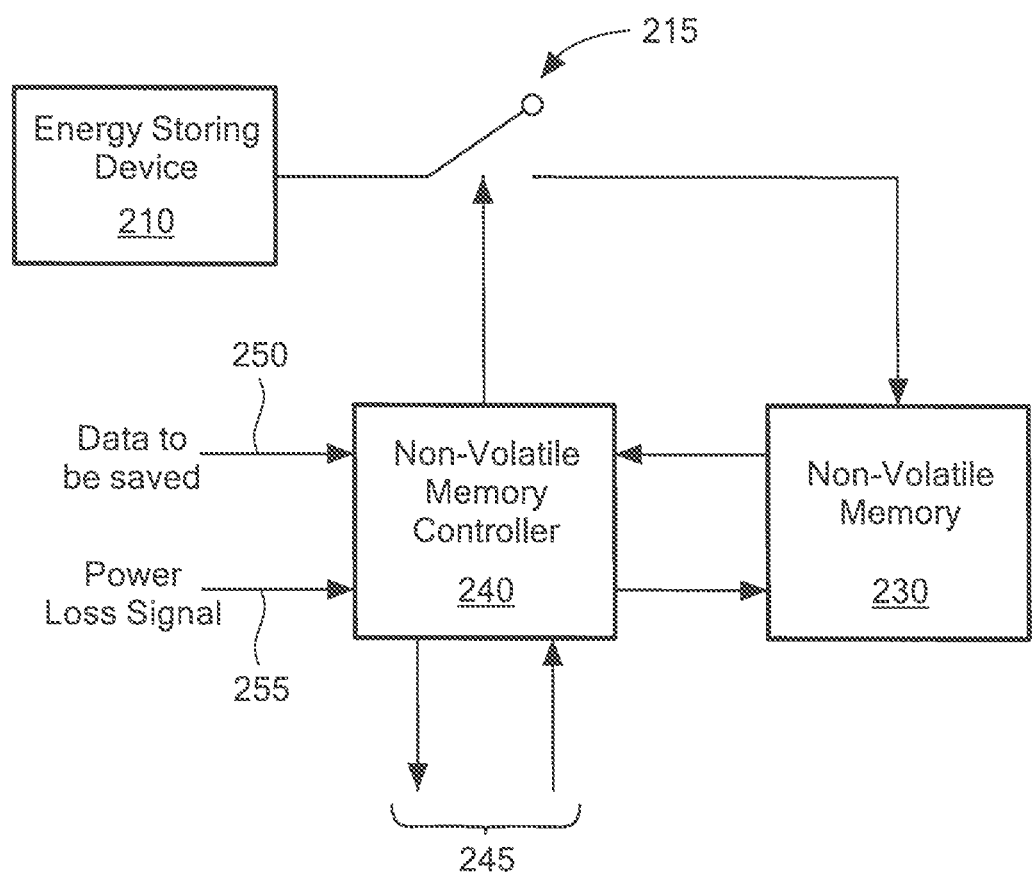
FIG. 2 is a block diagram of a circuit for storing information in non-volatile memory in response to a loss of power according to some embodiments.

Referring now to FIG. 2, a block diagram of a circuit for storing information in non-volatile memory in response to a loss of power is provided according to some embodiments. In an embodiment, an energy storage device 210 is configured for storing energy and for providing energy for saving data 250 (e.g., from a volatile memory) to non-volatile memory 230. Energy storage device 210 may, for example, be provided as one or more capacitive elements, a chargeable energy cell, one or more inductive elements or combinations of the above. A memory controller 240 is programmed and configured to receive data 250 and save the data to non-volatile memory 230 in response to a power loss signal 255. When the memory controller 240 receives power loss signal 255, controller 240 transmits a signal to one or more switch elements, here represented as a switch 215, that causes the switch (or switch elements) 215 to release power from the energy storage device 210 to power non-volatile memory (e.g. by closing the switch to provide a signal path between the energy storage device and the non-volatile memory).

The released power from energy storage device 210 allows data 250 which is forwarded from memory controller 240 to be stored in non-volatile memory 230. In an embodiment, non-volatile memory 230 is specially arranged to utilize that power from device 210 for only storing selected data to a dedicated selected portion of non-volatile memory 230 (e.g., a detached EEPROM block). In embodiments, that portion of non-volatile not used for storing the selected data is not powered by the released power from energy storage device 210. Further, in an embodiment, any portions of controller 240 needed to store data in memory 230 also receive power such as from an alternate power supply that provides power in the event of a power loss (e.g., backup power supply 350 of FIG. 3).

In an embodiment, during normal, fully powered operation, memory controller 240 manages the storage and transmission of data delivered through I/O interface 245, which can be stored in non-volatile memory 230 or volatile memory (not shown). In an embodiment, all of non-volatile memory 230 is powered and utilized during normal, fully powered operation.

Figure 3:
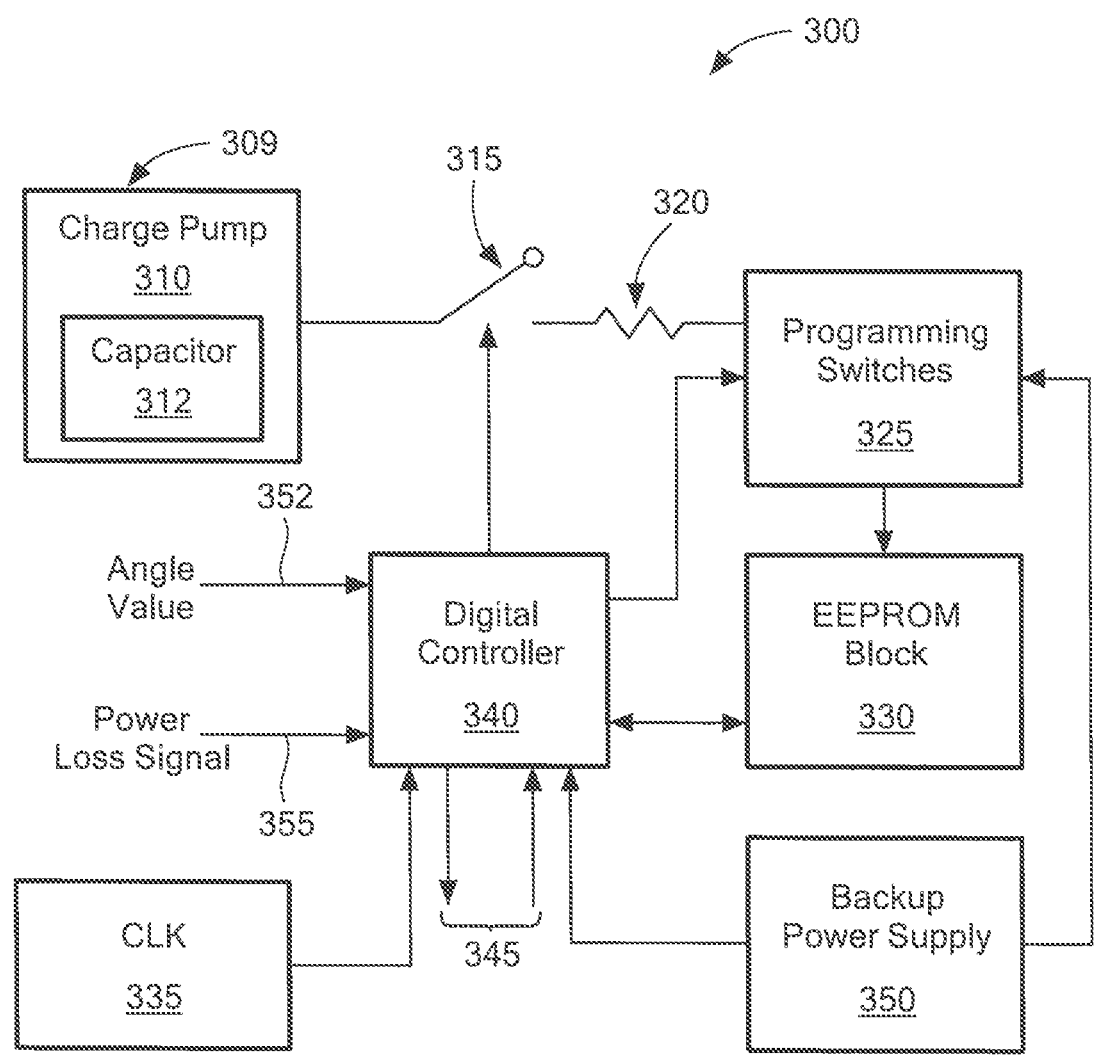
FIG. 3 is a block diagram of a circuit for storing information in an electrically erasable read only memory (EEPROM) block in response to a loss of power according to some embodiments.

Referring now to FIG. 3, a circuit 300 includes a charge pump 310 coupled through a switch 315 to a first terminal of a resistor 320. The second terminal of resistor 320 is coupled to an input of an EEPROM programming switch block 325. An output of programming switch block 325 is coupled to an electrically erasable programmable read only memory (EEPROM) block 330. When switches of switch block 325 are powered, they can be used to apply power to and program cells of EEPROM block 330 (depending upon the polarity of signal, a one or zero will be stored). EEPROM block 330 provides data to digital controller 340 in response to signals provided thereto. Digital controller 340 is coupled to switch 315 and programming switches 325 and provides control signals thereto such as for programming EEPROM block 330 with stored values. Digital controller 340 thus may configure programming switches 325 and may also access EEPROM 330 to read and/or write data thereto. In embodiments, an EEPROM block 330 is provided as a standalone single EEPROM block and may contain relatively simple and low power driver circuits which allows digital bits (e.g. ones and zeros) to be programmed concurrently via a single control pulse. Thus, use of a simple EEPROM block (e.g., a single row) enables concurrent programming of bits with a single pulse while needing a relatively small amount of power.

In an embodiment, a storage capacitor 312 within charge pump 310 is at substantially all times maintained at a reference voltage. The value of the reference voltage may be selected to suit the needs of a particular application, For example, in some applications, the reference voltage may be 15 V, in other applications the reference voltage may be 19 V and in still other applications other voltage levels greater than 19V or less than 15V may be used.

In other embodiments, the charge pump is charged when a loss of power is detected, and its voltage maintained at the reference voltage (e.g., via a low power control circuit).

The switches to the EEPROM block 330 are also preconfigured (that is, set during "normal power" operation) to write desired data. In an embodiment, a backup power source 350 is connected to digital controller 340 and programming switches 325, and maintains power to these components for a period of time in the event of a power loss sufficient to bias digital controller into an operating state so that digital controller can operate one or both of switches 315, 325, charge pump 310 is dedicated to charging EEPROM block 330 in the event of a power loss. Thus, in this embodiment, backup power supply is relatively small, i.e. stores a relatively small amount of power compared with the energy storage device (here provided from charge pump 310 and capacitor 312) which provides power to the non-volatile memory (here provided as EEPROM block 330). In some embodiments, backup power supply 350 may be omitted or provided as part of energy storage device 309 in which case, energy storage device 309 provides power to digital control 340 and switches 315, 325.

A power loss can be signaled to digital controller 340 by a power loss signal 355 (e.g., by way of a power loss detector such as described herein). In an embodiment, digital controller then closes switch 315 and delivers signals to programming switches 325 in order to power and program EEPROM block 330.

In response to a loss of power, in an embodiment, the capacitor 312 and charge pump 310 then deliver a burst of power to an independent non-volatile memory block. In an embodiment, power is provided to the non-volatile memory block at a substantially constant voltage for a predetermined period of time. In one embodiment, a burst of power is delivered at around the reference voltage for about 10 ms. In one embodiment, the reference voltage is about 15 V or 19 V and the predetermined period of time is about 10 ms. In an embodiment, the capacitor 312 and charge pump 310 then deliver a burst of power to the independent EEPROM block 330 via the resistor 320 so as to provide a non-instantaneous ramp up and guarantee the required rise time of a high voltage pulse, thereby protecting the integrity of floating gates' within the EEPROM block 330 and keep the EEPROM block programming switches 325 biased for 10 ms (with negligible or very small static current consumption). In view of the present disclosure, various embodiments can be implemented as would be realized by one of ordinary skill in the art without the use of a resistor (such as resistor 320) that similarly avoid impacting the integrity of the floating gates within EEPROM block 330.

In an embodiment, if a clock 335 is driving circuit 300 during normal operation, the clock can be stopped (i.e., so it discontinues drawing power) or disconnected from the controller 340 and programming switches 325 so as a digital block within the controller 340 is frozen with the correct addressing for the switches 325, so the backup power supply 350 providing power to controller 340 in the event of a power loss can be relatively small.

In an embodiment, a volatile memory register (e.g., a turns count register) that stores the state of a field element (e.g., data from a turns counter such as, e.g., provided by an angle value signal 352) stored could be powered from an independent sub-supply e.g., backup supply 350) that remains on through its own small capacitor.

In some systems which already include an external capacitor (e.g. an integrated circuit or chip having an external capacitor coupled thereto) there is the option of repurposing such capacitor so that it is used for loss of power biasing (e.g. as backup power supply 350). Thus, such existing components and/or circuitry may be used for loss-of-power biasing (e.g., to controller 340), thereby avoiding the need for extra package pins or additional external components.

Referring now to FIG. 4, a block diagram of a circuit 400 for storing information from register memory (e.g., volatile memory 483) to an EEPROM 485 in response to a loss of power is provided. Also referring to FIG. 5, an isometric view of a steering system 500 of a vehicle (not shown) which includes a circuit (e.g., circuit 400 of FIG. 4) for storing information in non-volatile memory in response to a loss of power is provided according to some embodiments.

With reference to FIG. 4, an embodiment, a circular vertical hall (CVH) element 415 provides angular measurements of a rotating object (see, e.g., wheel 525). CVH element 415 provides angular analog data to an analog front end 430, which further processes the data via filtering and amplification operation and forwards the processed data to an analog-to-digital (ADC) converter 440. The ADC converts the analog data into digital data 441 for processing by digital processing circuit 470. The circuit 400 can be powered from a power source (e.g., a battery and/or external power).

In other embodiments, the angle sensor 435 can be of a different type, for example GMR, AMR, TMR, vertical Hall sensors in X and Y directions.

Digital processing circuit 470 can include circuitry to perform numerous data processing functions including a turns counter, a zero-angle monitor, a calibration process, and an RPM calculator among other functions known to those of ordinary skill in the art.

The circuit 400 can be integrated with, for example, a control unit 510 positioned on a rack 520 (FIG. 5) while CVH 415 can be connected to wheel 525 (FIG. 5) and/or a steering sensor 530 (FIG. 5) of a steering system 500 (FIG. 5) driven by a motor 540 (FIG. 5).

The digital processing circuit 470 includes memory block 480 including volatile memory 483 and non-volatile memory with an EEPROM 485. Volatile memory 483 can be used to store data associated with the aforementioned processing functions including, for example, by providing a turns count register to rapidly track and update turns count data from, for example, a turns counter 484. EEPROM 485 can be used to retain data associated with these processes, and such data may be provided to EEPROM 485 at various points in time such as when the circuit is shut down and depowered. For example, calibration and startup parameters specific to the CVH 435 can be saved in EEPROM 485 for use during startup and initialization of the circuit. The position of steering wheel 525, for example, tracked by a turns count register, can be saved to EEPROM 485 when power to the steering system 500 is interrupted or turned off so that when the steering system 500 is powered back on, the turns count register can be updated via the EEPROM 485 containing its last known position.

Figure 6:
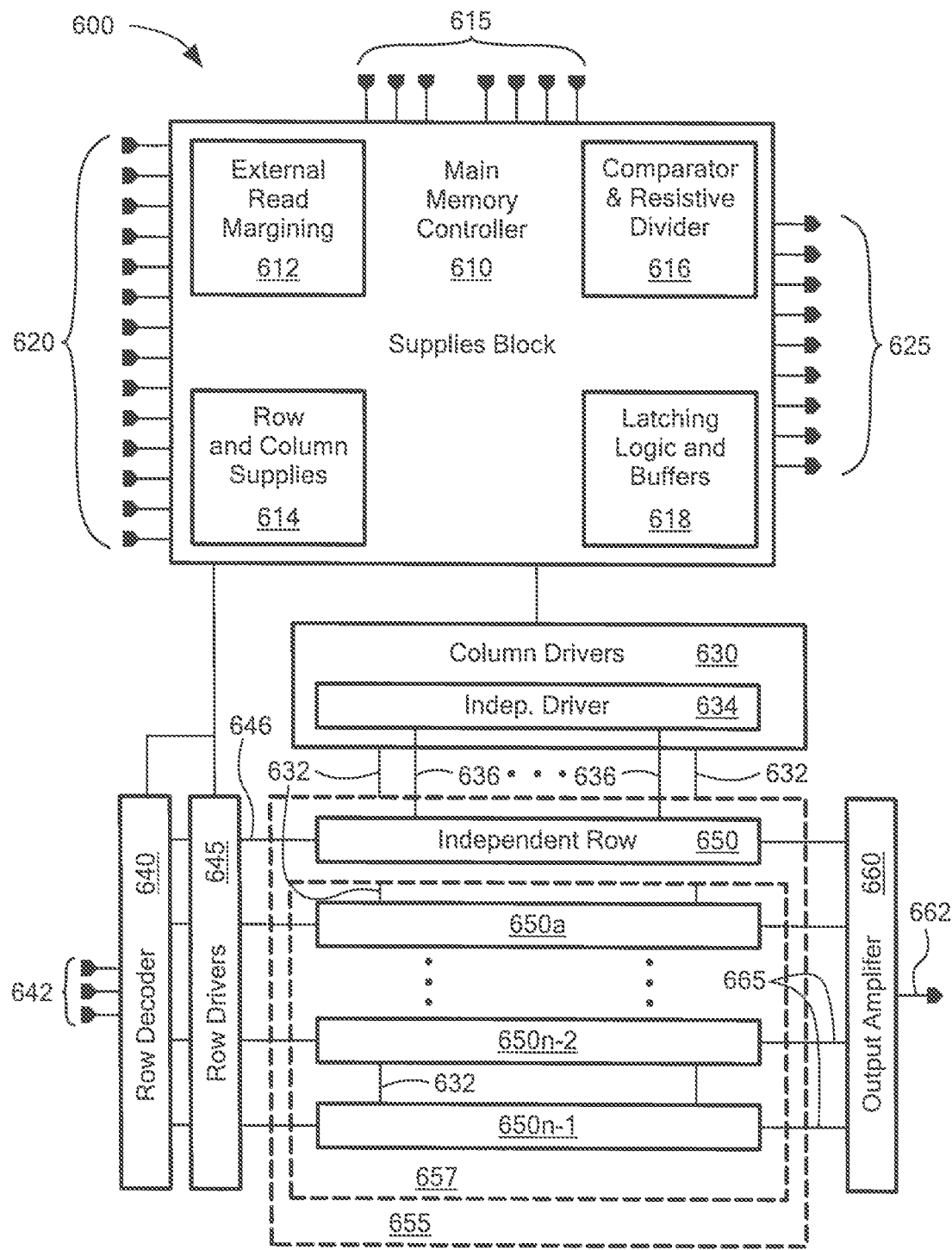
FIG. 6 is a block diagram of an electrically erasable read only memory (EEPROM) having a designated single EEPROM row for use in a circuit for storing information in non-volatile memory in response to a loss of power according to some embodiments.

Referring now to FIG. 6, a block diagram of an EEPROM 600 having a designated single EEPROM row 650 for use in a circuit for storing information in non-volatile memory in response to a loss of power is provided according to some embodiments. A main memory controller 610 includes inputs 615 and 620 for control signals and data to be stored in the EEPROM 600 and outputs 625 for signals and data transmitted from EPPROM 600. The memory controller 610 further includes components 612 for external read margining and 618 with latching logic and buffers as would be understood by one of ordinary skill in the art. Comparator and resistive divider block 616 and row and column supplies 614 help facilitate reading and writing data to EEPROM rows 650, 650a . . . 650n-1. During normal, fully powered operation, column drivers 630 and row drivers 645 (e.g., containing row and column programming switches) work in concert to read and write data to EEPROM rows 650, 650a . . . 650n-1. A row decoder 640 calculates the appropriate row signals during reading and writing and has inputs 642 for receiving external signals and data for saving data to EEPROM rows.

EEPROM row 650 is independently writable from memory controller 610 and an independent memory driver. Independent memory driver 634 can utilize direct connections 636 to write directly to independent row 650 without the need to fully power general row and column drivers 630 and 645 and connections 632 and 646, thus saving power that would otherwise be necessary to write to a non-independent row (e.g., rows 650a . . . 650n-1). In this embodiment, driver 634 drives each of the columns of the row, however, there is only one cell per column.

In should be appreciated that independent row 650 can be substituted for other memory configurations that can include, for example, blocks of memory cells formed from numerous columns and rows or portions thereof.

Figure 7:
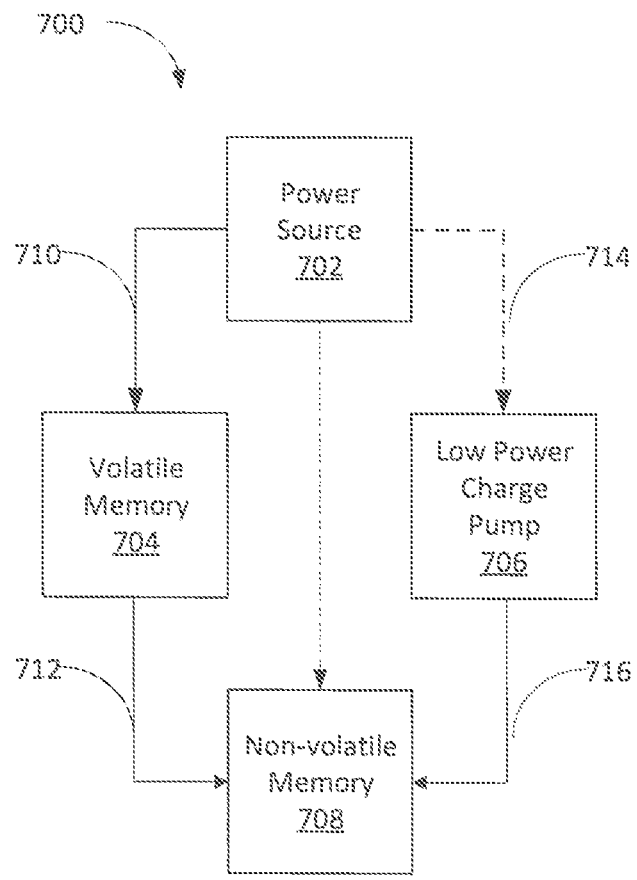
FIG. 7 is a block diagram of a system in accordance with an embodiment that includes a low power charge pump circuit.

In FIG. 7 is shown a block diagram of a system 700 including a low power charge pump circuit. The system 700 may, for example, be part of an embedded system, such as a control system for an automobile, airplane, or other vehicle, in which certain data (such as safety data or operational data) is desirable to be saved when there is a loss of power. Such data may sometimes be considered critical to system operation.

The system 700 includes a power source 702, a volatile memory 704, a low power charge pump 706, and a non-volatile memory 708. The power source 702 may be any conventional power source, and powers the volatile memory 704 via a power coupling 710 such as one or more wire conductors.

During a power loss event (e.g. loss of power from the power source 702), whether transient or permanent, data may be saved from the volatile memory 704 to the non-volatile memory 708 via a data bus 712. It is appreciated that, upon a loss of power, leakage currents in a volatile memory, such as volatile memory 704, eventually cause electric charge stored therein to dissipate; however, the persistence of readable charge levels, and thus savable data, in many conventional memories (e.g. DRAM circuits) may be on the order of several seconds. Thus, in certain situations, it may be sufficient to power only the non-volatile memory 708 as part of an emergency data saving operation.

Space to provide separate power storage and circuitry enabling this data saving operation may be heavily constrained by design requirements, especially in embedded systems such as those described above in connection with FIGS. 1 through 6. Thus, although the non-volatile memory 708 may be a memory requiring low power to program, such as an EEPROM, there may or may not be sufficient power storage (e.g. a large enough external capacitor or other battery) to power the entire non-volatile memory 708 during an emergency data saving event. To this end, disclosed embodiments provide a low power charge pump 706 that may be used to power at least a portion of the non-volatile memory during an emergency data saving event.

It is appreciated that the non-volatile memory 708 may be used in connection with non-power loss functions of the system 700, and may be powered by the power source 702 directly. However, if the power source 702 fails for any reason, the non-volatile memory 708 may lose its source of power and it (or a portion of it) must be powered for the emergency data saving event via alternate means, for which the low power charge pump 706 is provided. In some alternate embodiments, the non-volatile memory 708 may be used only for emergency data saving, and may be powered entirely by a separate power source, e.g. using the low power charge pump 706.

In embodiments, the low power charge pump 706 is configured to receive a power loss signal. When active, this power loss signal indicates to the low power charge pump 706 that it should provide power to the non-volatile memory 708 for an emergency data saving operation. The power loss signal optionally may be provided via an electrical signal 714 to the power source 702 (e.g. as an input to the low power charge pump 706 that indicates when there is no or low voltage present at the power source 702). Alternately, the power loss signal may be provided by other circuitry (not shown) that monitors electrical properties (e.g. a voltage or current output) of the power source 702 or the power coupling 710 for this purpose.

In embodiments, the low power charge pump 706 is coupled to the non-volatile memory 708 via a power coupling 716 (e.g. one or more wire conductors) to power the non-volatile memory 708 during an emergency write of data in the volatile memory 704. For example, programming an EEPROM may require that data are presented at certain inputs while two other inputs are held within a range of a desired electric potential difference for a given period of time. In some embodiments, such a potential difference and period of time may be, for example, about 14 volts (V), 14.5 V, 15 V, or 18 V for between about 0.1 milliseconds (ms) and 5 ms. The low power charge pump 706 provides this electric potential difference. The data may be stored in particular cells of the volatile memory 704, which may be coupled, via the data bus 712, directly to corresponding cells in a portion of the non-volatile memory 708 or in some other fashion for coupling memory cells known in the art. However, in some embodiments, the data are not written to the non-volatile memory 708 until the low power charge pump 706 receives the power loss signal and powers the non-volatile memory 708 for this purpose.

Figure 8:
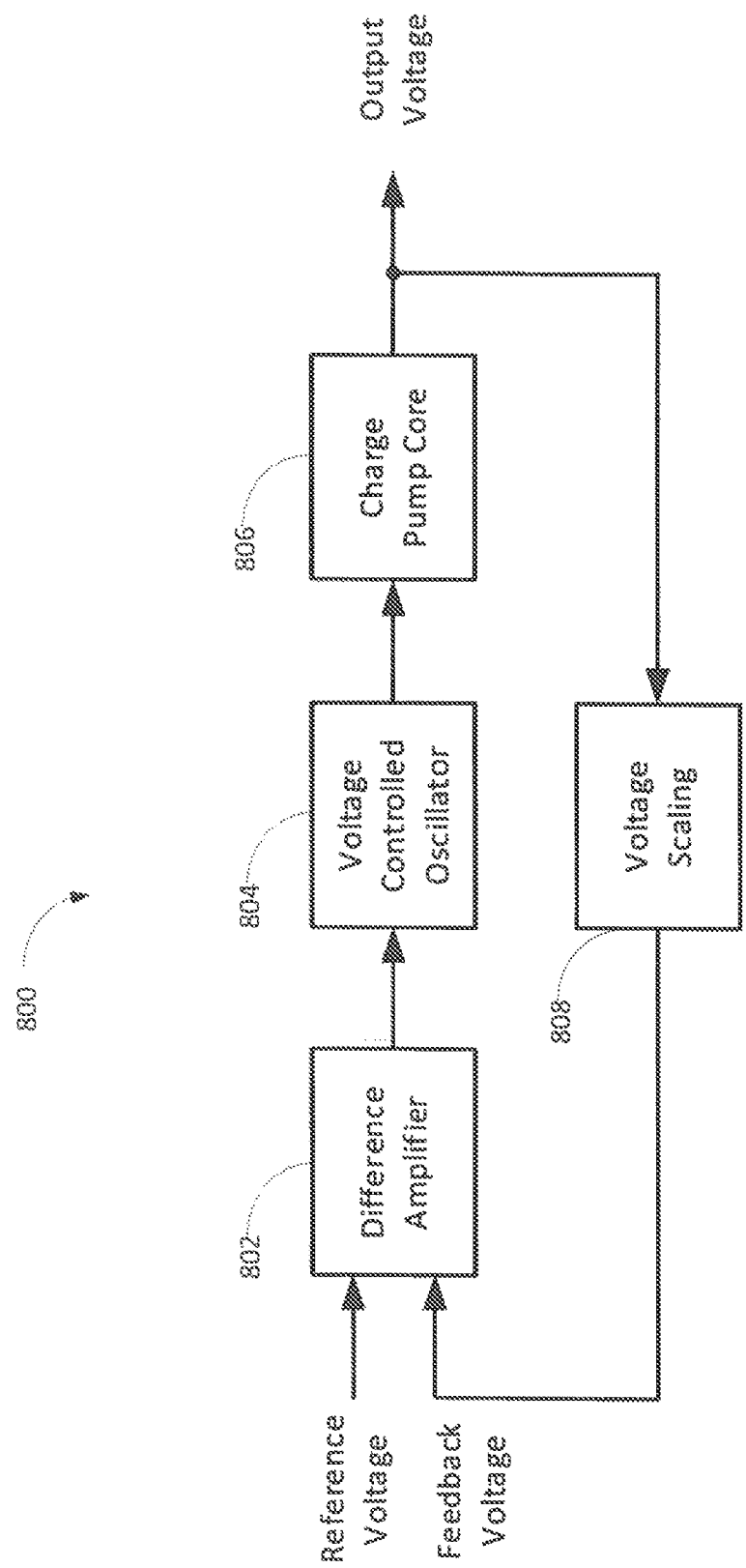
FIG. 8 is a block diagram of a low power charge pump circuit.

In FIG. 8 is shown a block diagram of an illustrative low power charge pump circuit 800. The low power charge pump circuit 800 may be used, for example, as the low power charge pump 706 of FIG. 7. The low power charge pump circuit 800 includes a voltage difference amplifier 802, a voltage controlled oscillator (VCO) 804, a charge pump core 806, and a voltage scaling circuit 808. The low power charge pump circuit 800 takes a reference voltage at its input, and provides a controlled voltage at its output. The reference voltage of the input may be, in some embodiments, a bandgap voltage reference as is known in the art.

The low power charge pump circuit 800 operates as follows. A difference between the reference voltage and the feedback voltage is used by the difference amplifier 802 to provide a control signal to the control terminal of a controllable source. The control signal may be a current signal or a voltage signal. In embodiments, the controllable source may be, for example, a VCO such as VCO 804 and the control signal may be a bias current provided to the VCO 804.

Thus, in one embodiment, when the low power charge pump circuit 800 is first activated, the reference voltage may be a bandgap voltage of approximately 1.2 volts, as known in the art, while an initial feedback voltage may be 0 volts. The difference amplifier 802, which may be, for example, a transconductance amplifier, converts this 1.2 volt difference into a bias current. The bias current may be converted into a voltage for controlling the VCO 804 using any technique known in the art. To activate the low power charge pump circuit 800, the input may include a switch that actuates to couple the reference voltage and the difference amplifier 802.

In response to receiving the control signals, the VCO 804 produces a signal having a frequency, which may be considered as a pulse frequency, that is proportional to the voltage difference between the reference voltage and the feedback voltage. The VCO 804 may be any voltage controlled oscillator known in the art, and the electrical pulses may have any desired shape, such as rectangular waves or sinusoidal waves. The initial pulse frequency will be at or near a maximum pulse frequency because the difference between the reference voltage and the feedback voltage is at or near a maximum value. In embodiments, the initial pulse frequency may be approximately 700 kilohertz (kHz). It is appreciated that the maximum pulse frequency is determined both by the electrical characteristics of the particular difference amplifier 802 and VCO 804 used, as discussed in more detail below, and thus that other maximum frequencies may be present in embodiments.

The electrical pulses carry energy to the charge pump core 806, which provides a powered output voltage. The charge pump core 806 may be any circuit known in the art that acts as a charge pump, for example a series of diode-and-capacitor stages that store energy at ever increasing voltages. It is appreciated that an electrical load coupled to the output voltage (e.g. the non-volatile memory 708 of FIG. 7) will gradually drain the energy stored in the charge pump core 806, reducing the output voltage. However, the components of the low power charge pump circuit 800 may be designed so that, at steady state, the VCO 804 regularly emits electrical pulses that re-energize the charge pump core 806 so as to restore the output voltage to its overall maximum.

In one embodiment, the steady state pulse frequency may be approximately 20 kHz. It is appreciated that the steady state pulse frequency is determined by the electrical properties of both the particular difference amplifier 802 and VCO 804 used, and thus that other steady state frequencies may be present in embodiments. Thus, different magnitudes of the output from the difference amplifier 802 may operate to drive a given VCO 804 at different rates, while different design parameters of the VCO 804 may produce different output signals that energize the charge pump core 806 at different rates. In particular, different loads coupled to the output voltage of the charge pump core 806 may require greater or lesser steady state pulse frequencies, as the case may be. It is expected that a person having ordinary skill in the art will appreciate how to adjust the design parameters of the difference amplifier 802, the VCO 804, and the charge pump core 806 to meet requirements of a given device-powering application.

The low power charge pump 800 achieves a steady state when the VCO 804 outputs periodic electrical pulses to the charge pump core 806 that each restore the output voltage to its maximum value. If the power consumption of the attached load is constant, then the output voltage has a constant average over time once the steady state is achieved. In some embodiments, the average output voltage at steady state is approximately 14.5 volts, which may be sufficient to program an EEPROM.

The "rise time" of the low power charge pump 800 is the time between initial activation of the low power charge pump 800 and the time when it first reaches the steady state. In some embodiments, including when the low power charge pump 800 is used in conjunction with an EEPROM, the rise time may be approximately 200 microseconds. It is appreciated that the rise time is determined in part as a function of the power consumption of the attached load, which is a factor that is outside the scope of the present disclosure. A person having ordinary skill in the art will appreciate how rise time is affected by the presence of loads coupled to the output voltage, and thus will understand how to select specific components to achieve a desired rise time.

The output voltage of the low power charge pump 800 is coupled to a voltage scaling circuit 808. The voltage scaling circuit 808 scales the output voltage to provide a feedback voltage that is compared to the input reference voltage by the difference amplifier 802. In embodiments, the voltage scaling circuit 808 may linearly scale the maximum output voltage down to the reference voltage, so that when the output voltage is maximized the difference amplifier 802 produces no bias current and the VCO 804 produces no electrical pulses. The voltage scaling circuit 808 may be a capacitive circuit, or a resistive circuit (e.g. a resistor divider), or a combination of capacitive and resistive circuits, or may be provided from any other circuit capable of performing a similar function.

In FIGS. 9A to 9E are shown plots of simulated voltages as a function of time at different places in the low power charge pump circuit 800 of FIG. 8. Each plot shows voltage on the vertical axis and time on the horizontal axis. Once the reference voltage (FIG. 9A) is applied at the input of the difference amplifier 802, a bias current begins to flow having the difference voltage (FIG. 9C). In response to the bias current, the VCO 804 begins to emit a series of electrical pulses (FIG. 9D) that energize the charge pump core 806. Each pulse increases the charge pump core 806 output voltage (FIG. 9E) by a given amount, represented as a fixed vertical gain over a short period of time (i.e., the pulse duration). Meanwhile, the attached load drains energy from the charge pump core 806 at a constant rate, represented as a fixed negative slope in the output voltage. Thus, FIG. 9E shows a jagged output voltage that increases fixed amounts (i.e. fixed vertical increases) due to energizing pulses from the charge pump core 806 and decreases at a constant rate (i.e. fixed negative slope) between the energizing pulses due to the de-energizing load. The increasing average output voltage over time is due to the fact that the energizing pulses emitted by the VCO 804 (FIG. 96) initially have a relatively high frequency, so the charge pump core 806 is energized at a greater rate than it is de-energized. However, eventually the feedback voltage (FIG. 9B) will increase to the reference voltage (FIG. 9A) and thereby cause the difference voltage (FIG. 9C) to oscillate about zero volts, and the steady-state will occur wherein the VCO 804 energizes the charge pump core 806 at precisely the average rate it is de-energized by the attached load.

Thus, FIG. 9A shows a reference voltage that remains constant over time.

FIG. 9B shows the feedback voltage over time. Each electrical pulse is indicated by an increase in voltage, and the gap between pulses is indicated by a decrease in voltage due to the attached load. It is appreciated that the attached load is always de-energizing the charge pump core 806, even while it is being re-energized by an electrical pulse; this is reflected in a shallower positive slope in the plots than would exist if the load were absent. It may be appreciated from FIGS. 9B and 9D that the pulse frequency is initially high, then decreases over time until a steady state is reached as described above.

FIG. 9C shows the difference voltage in the difference amplifier 802; that is, the reference voltage shown in FIG. 9A minus the feedback voltage shown in FIG. 9B. Note that at steady state, the average difference voltage is zero, and the VCO 804 produces electrical pulses at a rate that just re-energizes the charge pump core 806 to provide the maximum output voltage.

FIG. 9D shows the voltage over time at the output of the VCO 804. In this Figure is shown a series of electrical pulses whose pulse frequency is initially high, then decreases over time until steady state is reached. At the steady state, the pulse frequency is a constant, and the low power charge pump circuit 800 remains in this state until the attached energy source is depleted.

FIG. 9E shows the output voltage over time. It is appreciated that the output voltage plot of FIG. 9E has the same shape as the feedback voltage plot of FIG. 9B, because the latter is a linear scaling of the former by the voltage scaling circuit 808. At the steady state, the output voltage varies between a maximum output voltage and a slightly lower output voltage, due to power consumption of the attached load. However, this state is steady because this variation in the output voltage repeats over time, thereby establishing a fixed, average output voltage.

Advantageously, when the steady state is achieved, digital pulses are only generated sporadically. This means that the charge pump core 806 switches significantly less often than during startup. Because the circuitry is not continuously powered, the power savings are considerable.

The concepts, circuits, systems and techniques described herein find broad applicability in the sensor circuitry industry. Specifically, the conceived independent EEPROM row and described configurations therefor can be used in sensor systems that are based upon sensing and storing various types of continuous data that are used to track components thereof, such as generated from other components of vehicular systems like drive trains and other systems that need to store select sensitive data in the event of electric power interruptions).

It should be appreciated that portions of the processing described herein may be performed by circuits, such as a digital signal processor circuit, an application specific integrated circuit (ASIC), a field programmable gate array (FPGA), or conventional electrical or electronic systems or circuits. Some processing may be manually performed, while other processing blocks may be performed by circuitry and/or one or more processors. It should be noted that unless otherwise indicated herein, the particular sequences or processes described are illustrative only and can be varied without departing from the spirit of the concepts described and/or claimed herein. Thus, unless otherwise stated, the processes described are unordered meaning that, when possible, the sequences described can be performed in any convenient or desirable order.

While particular embodiments of concepts, systems, circuits and techniques have been shown and described, it will be apparent to those of ordinary skill in the art that various changes and modifications in form and details may be made therein without departing from the spirit and scope of the concepts, systems and techniques described herein. For example, some of the presented implementation examples show a system which saves a single piece of type of data. It will be appreciated that the concepts described herein can be used in systems in which it is necessary or desirable to save a variety of different types or pieces of data in which case it may be necessary to use EEPROMs having more than one block or row or to use multiple, single block or row EEPROMs and associated circuitry.

The data for saving in an independent EEPROM block is ideally selected depending upon the particular type of system fields that need to be restored upon startup (e.g. last known position in a GPS, orientation, time).

Having described preferred embodiments which serve to illustrate various concepts, systems circuits and techniques, which are the subject of this patent, it will now become apparent to those of ordinary skill in the art that other embodiments incorporating these concepts, systems circuits and techniques may be used. For example, it should be noted that individual concepts, features (or elements) and techniques of different embodiments described herein may be combined to form other embodiments not specifically set forth above. Furthermore, various concepts, features (or elements) and techniques, which are described in the context of a single embodiment, may also be provided separately or in any suitable sub-combination. It is thus expected that other embodiments not specifically described herein are also within the scope of the following claims.

In addition, it is intended that the scope of the present claims include all other foreseeable equivalents to the elements and structures as described herein and with reference to the drawing figures. Accordingly, the subject matter sought to be protected herein is to be limited only by the scope of the claims and their equivalents.

In the foregoing detailed description, various features of embodiments are grouped together in one or more individual embodiments for the purpose of streamlining the disclosure. This method of disclosure is not to be interpreted as reflecting an intention that a claim requires more features than are expressly recited therein. Rather, inventive aspects may lie in less than all features of each disclosed embodiment.

It should thus be appreciated that elements of different embodiments described herein may be combined to form other embodiments which may not be specifically set forth herein. Various elements, which are described in the context of a single embodiment, may also be provided separately or in any suitable sub-combination. Other embodiments not specifically described herein are also within the scope of the following claims.

It is felt, therefore that the concepts, systems, circuits and techniques described herein should not be limited by the above description, but only as defined by the spirit and scope of the following claims which encompass, within their scope, all such changes and modifications.

All publications and references cited herein are expressly incorporated herein by reference in their entirety.

What is claimed is:

1. A data storage circuit for storing data from volatile memory in response to a power loss, the data storage circuit comprising:

a non-volatile matrix of memory cells comprising a plurality of rows and a plurality of columns of memory cells including an independent row of memory cells; and a controller comprising a plurality of drivers including row and column drivers and an independent driver, the controller configured to:

in the absence of a power loss, write data from the volatile memory to the non-volatile matrix of memory cells by utilizing the row and column drivers to perform collective row and column operations; and in response to receiving a power loss signal, write data from said volatile memory to said independent row of memory cells by selectively supplying energy to the independent row driver, and not the row and column drivers, from a low power charge pump circuit;

wherein the low power charge pump circuit comprises:

an amplifier configured to provide at an amplifier output a signal having an electrical characteristic that is proportional to a voltage difference between a reference voltage and a feedback voltage;

a voltage-controlled oscillator (VCO) having an input coupled to the amplifier output, the VCO configured to provide at a VCO output a series of electrical pulses according to a pulse frequency that is proportional to the amplifier output signal;

a charge pump core having an input coupled to the VCO output, the charge pump core configured to provide an output voltage for the low power charge pump circuit according to energy received from the series of electrical pulses; and a voltage scaler, coupled to the output voltage for the low power charge pump circuit, the voltage scaler configured to produce the feedback voltage as a fraction of the output voltage for the low power charge pump circuit.

2. The circuit according to claim 1, wherein the amplifier comprises a transconductance amplifier.

3. The circuit according to claim 1, wherein the reference voltage comprises a bandgap voltage reference.

4. The circuit according to claim 1, wherein the voltage-controlled oscillator outputs the series of electrical pulses as rectangular waves.

5. The circuit according to claim 1, wherein a maximum pulse frequency of the series of electrical pulses is approximately 700 kilohertz.

6. The circuit according to claim 1, wherein a steady state pulse frequency of the series of electrical pulses is approximately 20 kilohertz.

7. The circuit according to claim 1, wherein the average output voltage at a steady state is approximately 14.5 volts.

8. The circuit according to claim 1, wherein a rise time between the output voltage being zero and the average output voltage having a steady state is approximately 200 microseconds.

9. The circuit according to claim 1, wherein the low power charge pump circuit comprises a switch that actuates, according to the power loss signal, to couple the reference voltage to the amplifier.

10. The circuit according to claim 1, wherein the non-volatile matrix of memory cells comprises an electrically erasable programmable read only memory (EEPROM).

11. A data storage circuit for storing data from volatile memory in response to a power loss, the data storage circuit comprising:
   storage means comprising a plurality of rows and a plurality of columns of memory cells including an independent row of memory cells; and
   controller means comprising a plurality of drivers including row and column drivers and an independent driver, the controller configured to:
      in the absence of a power loss, write data from the volatile memory to the storage means by utilizing the row and column drivers to perform collective row and column operations; and
      in response to receiving a power loss signal, write data from said volatile memory to said independent row of memory cells by selectively supplying energy to the independent row driver, and not the row and column drivers, from a low power charge pump circuit;
   wherein the low power charge pump circuit comprises:
      first means configured to provide at a first means output a signal having an electrical characteristic that is proportional to a voltage difference between a reference voltage and a feedback voltage;
      second means having an input coupled to the first means output, the second means configured to provide at a second means output a series of electrical pulses according to a pulse frequency that is proportional to the amplifier output signal;
      third means having an input coupled to the second means output, the third means configured to provide an output voltage for the low power charge pump circuit according to energy received from the series of electrical pulses; and
      fourth means, coupled to the output voltage for the low power charge pump circuit, the fourth means configured to produce the feedback voltage as a fraction of the output voltage for the low power charge pump circuit.

12. The circuit according to claim 11, wherein the first means comprise a transconductance amplifier.

13. The circuit according to claim 11, wherein the reference voltage comprises a bandgap voltage reference.

14. The circuit according to claim 11, wherein the second means output the series of electrical pulses as rectangular waves.

15. The circuit according to claim 11, wherein a maximum pulse frequency of the series of electrical pulses is approximately 700 kilohertz.

16. The circuit according to claim 11, wherein a steady state pulse frequency of the series of electrical pulses is approximately 20 kilohertz.

17. The circuit according to claim 11, wherein the average output voltage at a steady state is approximately 14.5 volts.

18. The circuit according to claim 11, wherein a rise time between the output voltage being zero and the average output voltage having a steady state is approximately 200 microseconds.

19. The circuit according to claim 11, wherein the low power charge pump circuit comprises switching means that actuate, according to the power loss signal, to couple the reference voltage to the first means.

20. The circuit according to claim 11, wherein the storage means comprise an electrically erasable programmable read only memory (EEPROM).

* * * * *

UNITED STATES PATENT AND TRADEMARK OFFICE
CERTIFICATE OF CORRECTION

PATENT NO. : 10,839,920 B2
APPLICATION NO. : 16/543867
DATED : November 17, 2020
INVENTOR(S) : Juan Manuel Cesaretti et al.

It is certified that error appears in the above-identified patent and that said Letters Patent is hereby corrected as shown below:

In the Specification

Column 1, Lines 31-32 delete "erasable read only" and replace with --erasable programmable read-only--.

Column 1, Line 43 delete "degrees e.g." and replace with --degrees, e.g.--.

Column 1, Line 67 delete "circuitry, for" and replace with --circuitry increase, for--.

Column 2, Line 26 delete "loss (b)" and replace with --loss; (b)--.

Column 2, Lines 34-35 delete "nonvolatile" and replace with --non-volatile--.

Column 2, Lines 35-36 delete "electrically erasable read only memory (EEPROM)" and replace with --EEPROM--.

Column 3, Line 2 delete "one);" and replace with --one;--.

Column 3, Line 15 delete "matrices," and replace with --matrices--.

Column 3, Line 33 delete "herein, data" and replace with --herein, a data--.

Column 3, Line 48 delete "electrically erasable programmable read only memory (EEPROM)" and replace with --EEPROM--.

Column 3, Line 64 delete "where" and replace with --wherein--.

Column 4, Line 27 delete "signal and a" and replace with --signal, and a--.

Column 5, Line 24 delete "cell;" and replace with --cells;--.

Signed and Sealed this
Seventh Day of December, 2021

Drew Hirshfeld
*Performing the Functions and Duties of the
Under Secretary of Commerce for Intellectual Property and
Director of the United States Patent and Trademark Office*

CERTIFICATE OF CORRECTION (continued)
U.S. Pat. No. 10,839,920 B2

Column 5, Lines 53-55 delete "In accordance with an integrated data storage circuit" and replace with --In accordance with an embodiment, an integrated data storage circuit--.

Column 6, Line 17 delete "herein" and replace with --herein,--.

Column 6, Line 22 delete "devices" and replace with --device--.

Column 6, Line 24 delete "nonvolatile" and replace with --non-volatile--.

Column 6, Line 24 delete "cells said" and replace with --cells, said--.

Column 6, Line 26 delete "nonvolatile" and replace with --non-volatile--.

Column 6, Line 28 delete "cell" and replace with --cells--.

Column 6, Line 54 delete "signal" and replace with --signal,--.

Column 8, Lines 1-2 delete "memory in response to a loss of power memory in response to a loss of power according" and replace with --memory in response to a loss of power according--.

Column 8, Lines 3-4 delete "electrically erasable read only memory (EEPROM)" and replace with --EEPROM--.

Column 9, Line 63 delete "non-volatile not" and replace with --non-volatile memory not--.

Column 10, Lines 15-16 delete "electrically erasable programmable read only memory (EEPROM)" and replace with --EEPROM--.

Column 10, Line 38 delete "application, For" and replace with --application. For--.

Column 10, Line 42 delete "19V" and replace with --19 V--.

Column 10, Line 42 delete "15V" and replace with --15 V--.

Column 10, Line 52 delete "controller into" and replace with --controller 340 into--.

Column 10, Line 53 delete "controller can" and replace with --controller 340 can--.

Column 10, Line 54 delete "325, charge" and replace with --325. Charge--.

Column 10, Lines 62-63 delete "309 in which case," and replace with --309, in which case--.

Column 11, Line 1 delete "controller" and replace with --controller 340--.

Column 11, Line 10 delete "ms" and replace with --milliseconds (ms)--.

CERTIFICATE OF CORRECTION (continued)
U.S. Pat. No. 10,839,920 B2

Column 11, Line 18 delete "gates'" and replace with --gates--.

Column 11, Line 38 delete "sub-supply e.g.," and replace with --sub-supply (e.g.,--.

Column 12, Line 40 delete "EPPROM" and replace with --EEPROM--.

Column 12, Line 64 delete "In" and replace with --It--.

Column 14, Line 41 delete "volts" and replace with --V--.

Column 14, Line 42 delete "volts" and replace with --V--.

Column 14, Line 44 delete "volt" and replace with --V--.

Column 15, Line 39 delete "volts" and replace with --V--.

Column 16, Line 22 delete "FIG. 96" and replace with --FIG. 9D--.

Column 17, Line 15 delete "interruptions)." and replace with --interruptions.--.

Column 17, Line 43 delete "multiple," and replace with --multiple--.

Column 17, Line 50 delete "systems circuits and" and replace with --systems, circuits and--.

Column 17, Line 53 delete "systems circuits and" and replace with --systems, circuits and--.

Column 18, Line 18 delete "therefore" and replace with --therefore,--.